Nov. 5, 1968 W. C. MYERS ETAL 3,409,800
FIELD EFFECT TRANSISTOR CONTROL CIRCUITRY
FOR MULTI-AXIS DISPLAY SYSTEMS
Filed July 1, 1966 2 Sheets-Sheet 1
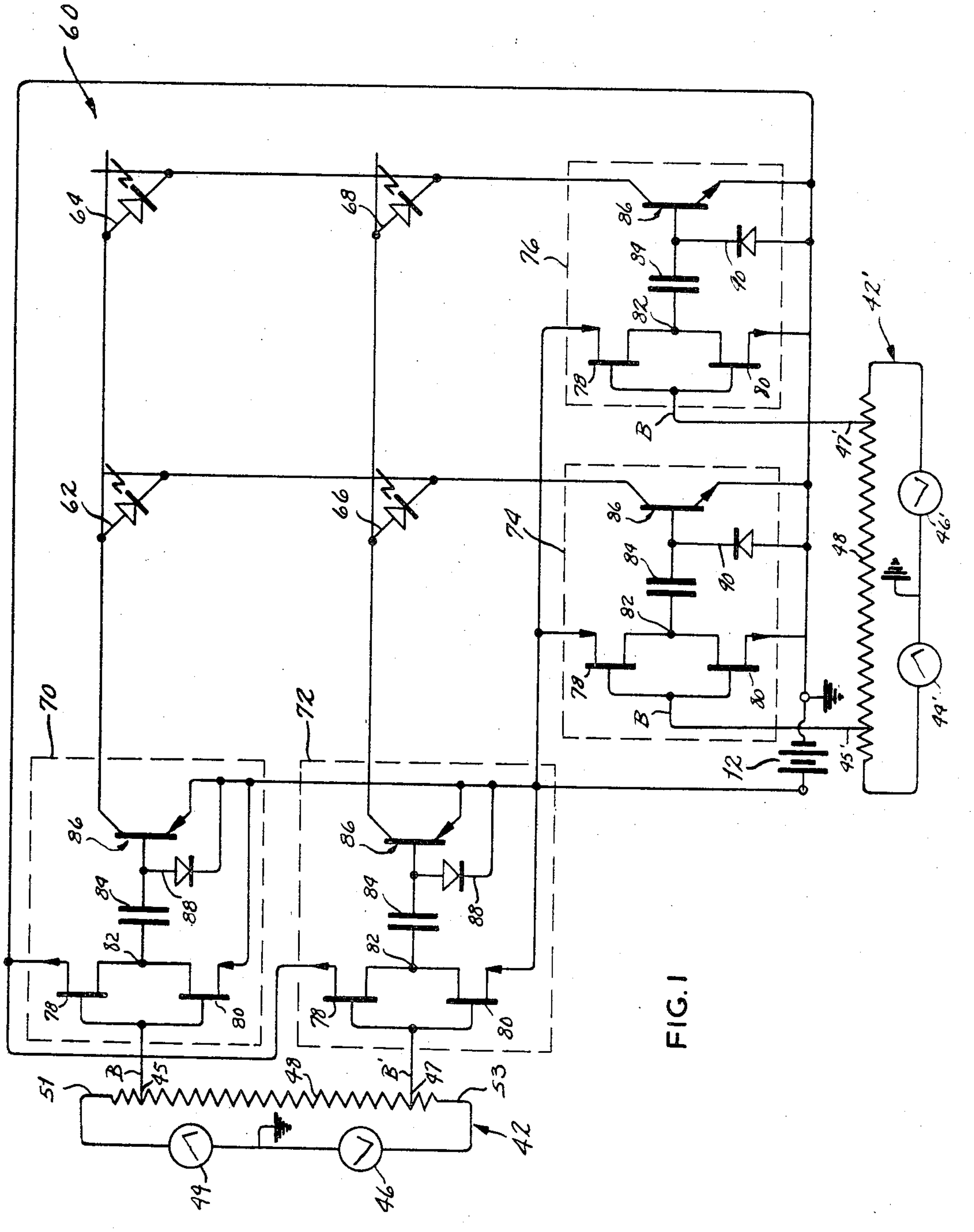
FIG. I
INVENTORS
WILLIAM C. MYERS
DAVID L. GRANTEER
BY Harold [signature]
ATTORNEY INVENTORS
WILLIAM C. MYERS
DAVID L. GRANTEER
BY Harold R. Patton
ATTORNEY United States Patent Office 3,409,800
Patented Nov. 5, 1968

3,409,800
FIELD EFFECT TRANSISTOR CONTROL CIRCUITRY FOR MULTI-AXIS DISPLAY SYSTEMS

William C. Myers, Ballwin, and David L. Granteer, Overland, Mo., assignors to Monsanto Company, St. Louis, Mo., a corporation of Delaware Continuation-in-part of application Ser. No. 510,639, Nov. 30, 1965. This application July 1, 1966, Ser. No. 562,326
8 Claims. (Cl. 315—169)

ABSTRACT OF THE DISCLOSURE

A double-axis array of electroluminescent devices, each connected in series circuit with the collector-emitter path of a switching transistor and a D.C. power supply. Each transistor has its base coupled by means of a capacitor to a circuit consisting of the series connection of enhancement and depletion type field-effect transistors, whose gate electrodes are connected to a common control voltage source. Separate control voltage sources are provided for each axis of the array so that the control circuits associated with each axis may be sequentially and synchronously actuated to produce a T.V. type scanning of the electroluminescent devices.

Figure 2A:
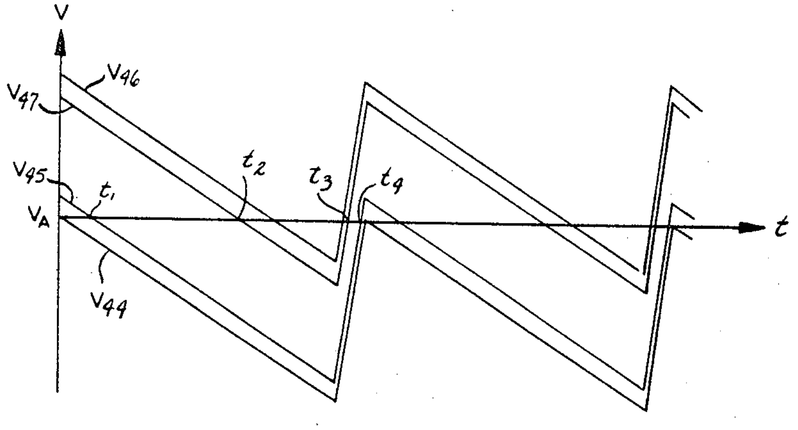

This application is a continuation-in-part of copending application Ser. No. 510,639, filed Nov. 30, 1965, by William C. Myers and David L. Granteer.

The invention of the instant application relates generally to electrical control circuits, and more particularly to circuits employing unipolar, or as commonly referred to, field-effect transistors to control the supply of electrical energy in a scanning or double-axis display system. The application referred to hereinabove disclosed similar circuitry utilizing a pair of opposite conductivity field-effect transistors to control the energization of devices, especially electroluminescent elements. Although such circuitry is suitable for single-axis display applications, it is not particularly suited to double-axis or CRT-type scanning applications.

The general purpose of the circuitry disclosed in this application is to provide circuitry similar to that described in our copending application but for the purpose of controlling the supply of electrical energy to devices comprising a dual-axis display system. To attain this, the present invention employs two opposite conductivity field-effect transistors, one of which operates in the enhancement switching mode and the other of which operates in the depletion switching mode to control auxiliary solid state switches, which turn light-emitting devices on and off in a predetermined scanning sequence.

An object of the present invention is the provision of a unique combination of field-effect transistors in combination with solid state switches to control the actuation of a plurality of light-emitting devices or the like.

Another object is to provide control circuitry which is particularly suited for fabrication by integrated circuit techniques and which employs a single electrical supply source to power a plurality of display elements.

A further object of the invention is the provision of an electrical control system for electroluminescent arrays wherein field-effect transistors having relatively high input impedances and low input capacitances are used to permit dual-axis scanning of such arrays.

In the present invention these objects (as well as others apparent herein) are achieved generally by providing a pair of opposite conductivity field effect transistors which operate in a switching mode to control the actuation of a plurality of solid state switching elements. The switching elements are connected in series circuit with electroluminescent devices and a source of electrical energy. By properly applying control potentials in a sweeping manner to the field-effect control circuits, the electroluminescent devices may be energized such that a dual-axis scanning is effected.

Figure 2B:
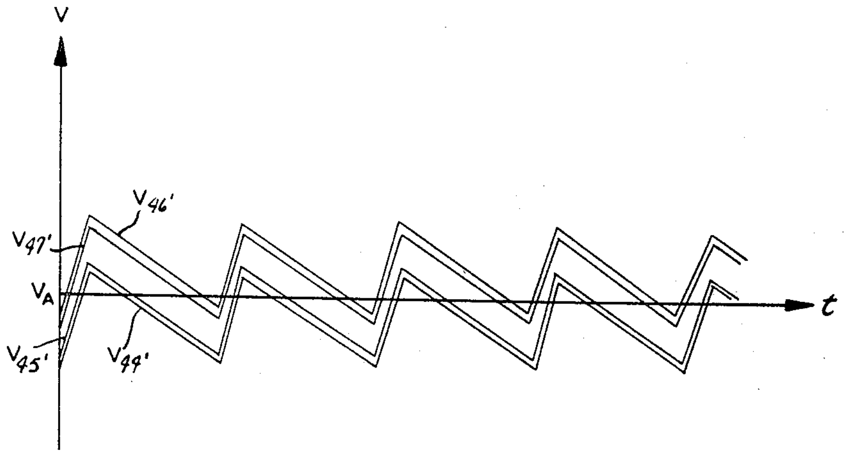
Figure 3:
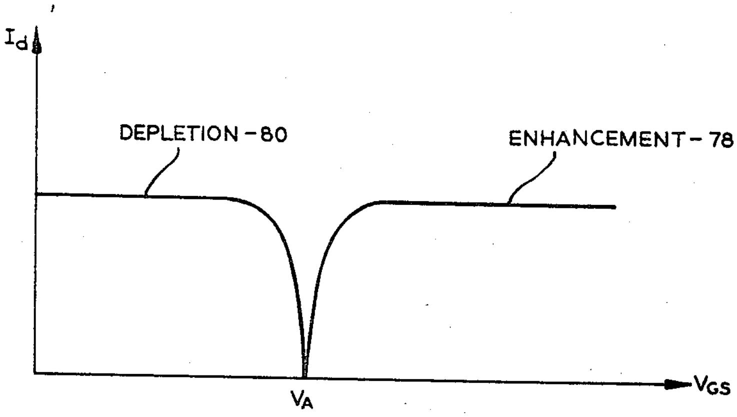

Utilization of the invention will become apparent to those skilled in the art from the disclosures made in the following description of a preferred embodiment of the invention as illustrated in the accompanying drawings, in which:

FIG. 1 is a schematic circuit diagram of a simplified dual-axis electroluminescent array utilizing the field-effect control circuits of the present invention;

FIGS. 2(*a*) and 2(*b*) are graphical representations of typical wave forms used to implement the dual axis scanning of the circuitry of FIG. 1; and FIG. 3 is a graphical representation of the current v. control voltage characteristics of the field-effect transistors of FIG. 1.

Referring now to the drawings wherein like reference characters designate like or corresponding parts throughout the figures, there is shown in FIG. 1 a double- or dual-axis arrangement which utilizes opposite-conductivity field-effect transistor circuits to control the scanning of a plurality of electroluminescent elements. The double axis array illustrated is generally designated 60 and consists of four electroluminescent cells 62, 64, 66 and 68 (hereinafter referred to as E.L. cells). Preferably the E.L. cells are III–V compound, light-emitting diodes consisting of two opposite conductivity (P- and N-type) regions which meet at a junction. These E.L. cells are characterized by their ability to emanate visible light from their junctions when current passes through them in the forward direction. It should be understood that although a four element array is illustrated, the number of E.L. cells which may be controlled by the circuits of the present invention is not so limited but may be extended as desired. Furthermore, although E.L. diodes, such as commercially available gallium-arsenide-phosphide diodes, are illustrated other current responsive light-emitting devices, such as electroluminescent phosphorous layers, cells, or strips could be used in the present invention. Alternately voltage-responsive light-emitters, infrared emitters, heat emitters, relay coils or the like could be employed.

The control units designated by the dashed lines 70 and 72 are the vertical control units for the four-elements, double-axis array 60. The vertical control unit 70 selectively couples the positive terminal of the battery 12 to the anode electrodes of the E.L. diodes 62 and 64 in a manner to be described hereinafter. Similarly the vertical control unit 72 selectively couples the positive terminal of the power supply battery 12 to the anode electrodes of the E.L. diodes 66 and 68.

The horizontal control of the double-axis array 60 is brought about by means of horizontal control units, indicated by the dashed lines 74 and 76, which selectively coupled the negative terminal of the power supply battery 12 to the cathode electrodes of the E.L. diodes 62, 66 and 64, 68 respectively. Thus, the actuation of a vertical control unit and a horizontal control unit to simultaneously couple the anode and cathode of an E.L. diode to the positive and negative terminals of the battery 12 will allow current to flow and cause the diode to emit visible light.

Voltage divider networks 42 and 42' are employed to repetitively sweep control potentials to the terminals (indicated as B and B') of the vertical control units 70, 72 and the horizontal control units 74, 76 respectively. The voltage divider network 42 consists of two synchronized linear ramp voltage generators 44, 46, the outputs of which are connected to respective ends of a resistor 48 having two voltage pick-off taps 45, 47 intermediate its ends. The tap 45 is connected to the control terminals B of the vertical control circuits 70 and the tap 47 is connected to the control terminal B of the vertical control circuit 72. Similarly the voltage divider network 42' consists of two synchronized linear ramp voltage generators 44', 46', the outputs of which are connected to respective ends of a resistor 48 having two voltage pick-off taps 45', 47' intermediate its ends.

In the embodiment illustrated the voltage generators 44 and 46 supply the repetitive complementary voltage ramp signals $V_{44}$ and $V_{46}$ indicated by the waveforms of FIG. 2(*a*). The voltage ramp signal 44 is applied to the upper end 51 of the voltage pick-off resistor 48 and the voltage ramp signal $V_{46}$ is applied to its opposite lower end 53. It should be noted from FIG. 2, that at any point of time (*t*) the voltage signals $V_{44}$ and $V_{46}$ establish a constant voltage drop across the resistor 48. The signal $V_{46}$ decreases at a predetermined rate from a maximum voltage, sweeps through an arbitrary actuation control potential $V_A$ to its minimum value, and then resets rapidly to its initial value. The signal $V_{44}$ begins at the potential $V_A$ and increases negatively at the same rate as voltage 46, until it is also reset simultaneously with the resetting of voltage 46 to its initial value. It should be noted that the maximum negative value of the signal $V_{44}$ is equal to the maximum positive value of the signal $V_{46}$.

It should be apparent that the combined effect of the voltages $V_{44}$ and $V_{46}$ in the arrangement illustrated is to sweep the control potential $V_A$ along the resistor 48 from the end 51 to the end 53 with a repetition rate dependent upon the frequency of the signals. As may be seen from the waveforms indicated at $V_{45}$ and $V_{47}$ in FIG. 2(*a*), the control terminals B see the control potential at pick-off terminals 45 and 47 at times $t_1$, and $t_2$ respectively during the sweep portion of the voltage cycle and at times $t_3$ and $t_4$ during the reset or "fly-back" portion thereof.

Inasmuch as the circuit arrangement and operation of the voltage divider network 42' is essentially identical to network 42, just described, its description will not be given in detail. However, it should be noted that the frequency of the voltage wave forms $V_{44'}$, $V_{46'}$ (FIG. 2(*b*)) supplied by generators 44' and 46' is twice that supplied by generators 44 and 46. As will be more fully understood hereinafter, this permits the horizontal and vertical (double-axis) scanning of the E.L. cells 62, 64, 66, 68. That is, the horizontal control units 74 and 76 will be actuated for each actuation of each of the vertical control units 70 and 72 and E.L. diodes 62, 64, 66, and 68 will be turned on in serial sequence.

Each of the control units 70, 72, 74 and 76 includes two field effect transistors 78 and 80 whose drain electrodes are connected together at junction point 82 and whose gate electrodes are connected together at the control terminal B. The source electrodes of the transistors 78 of the vertical control units 70, 72 and the transistors 80 of the horizontal control units 74, 76 are connected to the negative terminal of the battery 12, while the source electrodes of the transistors 80 of the vertical control units 70, 72 and the transistors 78 of the horizontal control units 74, 76 are connected to the positive terminal of the battery. In the vertical control units the field-effect transistors 78 are of the N-conductivity type and are selected to operate in the enhancement mode, while those of the horizontal control units 72 and 74 are of P-conductivity type and are selected to operate in the enhancement mode. In the vertical control unit 70, 72 the field effect transistors 80 are of P-conductivity type and are selected to operate in the depletion mode, while those of the horizontal units 74, 76 are of N-conductivity type and are selected to operate in the depletion mode.

Field effect transistors 78 and 80 are semiconductor devices preferably of the conventional MOS type. Often such devices are referred to as unipolar devices because current flow in the channel consists of either "hole" or "electron" transfer rather than both. Whether a field effect transistor is of the depletion or enhancement type depends upon their inherent material construction and the respective modes of operation are discussed by L. W. Atwood in the IBM Technical Disclosure Bulletin "Field Effect Transistor Circuits," vol. 6, No. 9, February 1964. In either case they are characterized by their high input impedance (approximately $10^{14}$ ohms) and low input capacitance (approximately 2–10 pf.) which make them especially suited for high speed scanning circuits. In the present invention the drain current-control voltage characteristics of the field effect transistors 78 and 80 are chosen such that they are related as indicated in FIG. 3. As may be seen, the depletion type field-effect transistor response to potentials less than the control potential $V_A$ is similar to an open switch and to potentials greater than $V_A$ is similar to a closed switch. On the other hand the enhancement type field-effect transistor response to potentials less than the control potential $V_A$ is similar to a closed switch and to potentials greater than $V_A$ is similar to an open switch. As will become apparent hereinafter, opposite conductivity field-effect transistors having these general characteristics and operating in the switching mode on each side of a critical control potential provide circuitry for controlling double-axis scanning wherein a single supply source is employed.

Connected to the junction point 82 between the source electrodes are capacitors 84 which couple the drain electrodes of the field effect transistors 78, 80 to the base electrodes of transistors 86.

In the case of the vertical units 70, 72 the transistors 86 are PNP type transistors, while in the case of the horizontal control units 74, 76 the transistors 86 are of the NPN type. The collectors of the transistors 86 of the vertical control unit 70 and 72 are connected to the anodes of the E.L. diodes 62, 64 and 66, 68 respectively. The emitter electrodes of these transistors are connected to the positive terminal of the power supply battery 12. The collectors of the transistors 86 of the horizontal control units 74 and 76 are connected to the cathodes of the E.L. diodes 62, 66 and 64, 68 respectively. The emitters of these transistors are connected to the negative terminal of the power supply battery 12.

In the vertical control unit circuits, diodes 88 are provided with their anodes connected to the respective bases of the PNP transistors 86 and their cathodes connected to the emitters of these transistors. In the horizontal control unit circuits, diodes 90 are similarly provided except that they are poled in the opposite direction between the bases and emitters of the NPN transistors 86.

The operation of the double axis array circuitry 60 may be best understood by assuming that the voltage divider networks 42 and 42' are at some instant of time supplying appropriate actuation control potential $V_A$ to the B terminals of the vertical control unit 70 and the horizontal control unit 74. First consider the operation of control unit 70 and assume that in their state just prior to the application of the potential $V_A$ to the gate electrodes, the transistors 78 and 80 essentially appear as closed and open switches respectively because of their enhancement and depletion modes of operation (depicted in FIG. 3). In this state the capacitor 84 will be charged to a steady-state condition and substantially no current flows in the emitter-base path of the transistor 86. However, at the instant in time under consideration, the control potential A will cause the transistors 78 and 80 to switch states so that transistor 78 then appears as a closed switch and transistor 80 will appear as an open switch. This enables a pulse of current to flow in the circuit path traced from the positive terminal of battery 12, through the emitter-base path of transistor 86, the capacitor 84, the field effect transistor 78 and back to the negative terminal of the battery 12, as the capacitor 84 charges. This current pulse renders the emitter-collector path of the transistor 86 conductive so that a current pulse may be supplied from the battery 12 to the anode of the E.L. cell 62.

Simultaneous with this happening, control unit 74 undergoes like actuation so that the circuit from the cathode of the E. L. cell 62 back to the negative terminal of the battery 12 through the collector-emitter path of the transistor 86 is also rendered conductive and the E.L. cell is therefore energized and a visible light pulse generated.

By choosing the value of the capacitor 84 of the control unit 70 sufficiently greater than capacitors 84 of the control units 74 and 76, the circuit path from the positive terminal of the battery 12 can be maintained conductive for a sufficiently long period of time, such that control unit 74 may be deactuated and control unit 76 actuated. In this manner the E.L. cell 64 can be energized from the battery 12 in the same manner as the E.L. cell 62 was energized and horizontal scanning accomplished.

Inasmuch as the circuitry of control unit 72 functions in the same manner as unit 70, and that of control units 74 and 76 functions in the same manner as unit 70 (except for reserve polarities as corresponding points), the operational description of these remaining units will not be given in detail.

As was stated above, the control potential $V_A$ is also applied to the control terminals B during the "fly-back" portion of the sweeping cycles. This resets the field effect transistors to their initial states so that the scan sweeping may be repeated. The diodes 88 and 90 of the vertical control units and horizontal control units respectively are poled such that the charge built up on the capacitors of each unit are drained off when the field effect transistors are so returned to their initial state.

By properly selecting the control voltages applied to the B terminals and the coincidence of actuation of the vertical and horizontal control units, the E.L. diodes 62, 64, 66, and 68 will emit pulses of light individually, in combination, and in any programmed sequence. A raster of a predetermined pattern of scanning lines is obtainable, with attendant means (not shown) for modulation of the intensity of the E.L. diodes or other utilization devices.

Many modifications and variations of the present invention are possible in view of the above teachings. Therefore, it is to be understood, that the invention may be practiced otherwise than as specifically described.

We claim:

1. For use in controlling the supply of electrical energy to a double-axis array of utilization devices, the electrical circuit comprising a pluarlity of N rows and M columns of utilization devices, a source of electrical energy, a plurality of normally-nonconducting switching means, connected in series circuit with each of said utilization devices and said source of electrical energy, for actuating said utilization devices when switched to their conductive state,

*M+N* electrical control circuits, each electrically coupled to one of said plurality of switching means for selectively rendering said switching means conductive, each control circuit including a first field effect transistor characterized by its operation in the enhancement mode, a second field effect transistor of opposite conductivity to said first field effect transistor and characterized by its operation in the depletion mode, said first and second field effect transistors having their source-drain current paths connected in series with said source of electrical energy, the gate and drain electrodes of said first effect transistors being respectively connected toegther, the connected together drain electrodes being electrically coupled to at least one of said plurality of switching means, control voltage source means connected to said connected-together gate electrodes of said first and second field effect transistors, whereby energization of a utilization device is provided by energizing the field effect transistor control circuits associated with the switching means connected in series circuit with said source of electrical energy and said utilization device.

2. The circuitry of claim 1, wherein the characteristics of said field effect transistors are chosen such that at a predetermined control potential applied to the gate electrodes of each, said first field effect transistor switches from a normally-nonconducting state to a conducting state and said second field effect transistor switches from a conducting state to a nonconducting state.

3. The circuit as defined in claim 1, wherein each of said switching means comprises a transistor having a base electrode and a collector-emitter path connected in series circuit between said source of electrical energy and at least one of said utilization devices, together with capacitance means for electrically coupling said base electrode of said transistor to said connected-together drain electrodes of said control circuit field effect transistors.

4. The circuit as defined in claim 2, wherein diode means are connected between said base and emitter electrodes of said transistors, said diodes being poled to provide a by-pass discharge path in shunt with the base-emitter path of said transistor.

5. For use in controlling the supply of electrical energy to a double-axis array of electroluminescent devices, the electrical circuit comprising a plurality of N rows and M columns of electroluminescent devices, a source of D.C. electrical energy, a plurality of normally-nonconducting switching means, connected in series circuit with each of said electroluminescent devices and said source of electrical energy, for actuating said electroluminescent devices when switched to their conductive state,

*M+N* electrical control circuits, each electrically coupled to one of said plurality of switching means for selectively rendering said switching means conductive, each control circuit including a first field effect transistor characterized by its operation in the enhancement switching mode, a second field effect transistor of opposite conductivity to said first field effect transistor and characterized by its operation in the depletion switching mode, said first and second field effect transistors having their source-drain current paths connected in series with said source of electrical energy, the gate and drain electrodes of said field effect transistors being respectively connected together, the connected together drain electrodes being electrically coupled to at least one of said plurality of switching means, control voltage source means connected to said connected-together gate electrodes of said first and second field effect transistors, whereby energization of an electroluminescent device is provided by energizing the field-effect transistor control circuits associated with the switching means connected in series circuit with said source of electrical energy and said electroluminescent device.

6. The circuitry of claim 5, wherein the characteristics of said field effect transistors are chosen such that at a predetermined control potential applied to the gate electrodes of each, said first field effect transistor switches from a normally-nonconducting state to a conducting state and said second field effect transistor switches from a conducting state to a nonconducting state.

7. The circuit as defined in claim 5, wherein each of said switching means comprises a transistor having a base electrode and a collector-emitter path connected in series circuit between said source of electrical energy and at least one of said utilization devices, together with capacitance means for electrically coupling said base electrode of said transistor to said connected-together drain electrodes of said control circuit field effect transistors.

8. The circuit as defined in claim 7, wherein diode means are connected between said base and emitter electrodes of said transistors, said diodes being poled to provide a by-pass discharge path in shunt with the base-emitter path of said transistor.

References Cited

UNITED STATES PATENTS

| | | | |
|---|---|---|---|
| 3,145,368 | 8/1964 | Hoover | 340—173 |
| 3,205,403 | 9/1965 | Schwertz | 315—169 |
| 3,246,162 | 4/1966 | Te Ning Chin | 250—211 |
| 3,343,128 | 9/1967 | Rogers | 340—166 |

JOHN W. HUCKERT, *Primary Examiner.*

R. F. SANDLER, *Assistant Examiner.*